United States Patent [19]

Yonemaru

[11] Patent Number: 5,187,483
[45] Date of Patent: Feb. 16, 1993

[54] SERIAL-TO-PARALLEL TYPE ANALOG-DIGITAL CONVERTING APPARATUS AND OPERATING METHOD THEREOF

[75] Inventor: Masashi Yonemaru, Chiba, Japan

[73] Assignee: Sharp Kabushiki Kaisha, Osaka, Japan

[21] Appl. No.: 798,617

[22] Filed: Nov. 26, 1991

[30] Foreign Application Priority Data

Nov. 28, 1990 [JP] Japan .................. 2-332162

[51] Int. Cl.⁵ .......................................... H03M 1/14
[52] U.S. Cl. .................................. 341/156; 341/159
[58] Field of Search ............... 341/118, 159, 161, 156

[56] References Cited

U.S. PATENT DOCUMENTS

| | | | |
|---|---|---|---|
| 4,533,903 | 8/1985 | Yamada et al. | 341/156 |
| 4,559,522 | 12/1985 | Sekino et al. | 341/133 |
| 4,599,599 | 7/1986 | Sekino et al. | 341/133 |
| 4,903,028 | 2/1990 | Fukushima | 341/156 |
| 5,019,820 | 5/1991 | Matsuzawa et al. | 341/156 |

FOREIGN PATENT DOCUMENTS 1-189229  7/1989  Japan .
1-279634 11/1989  Japan .
2-202224  8/1990  Japan .

OTHER PUBLICATIONS

"A 20 Hz 8 bit Half-Flash CMOS A/D Converter", ICD88-8, pp. 51-58.
Institute of Electronics, Information and Communication Engineers, 1989 Spring National Conference, pp. 5-396, 5-397.

Primary Examiner—Marc Hoff
Attorney, Agent, or Firm—David G. Conlin; Robert F. O'Connell

[57] ABSTRACT

A serial-to-parallel type A/D converter includes a resistance array, a plurality of comparators for upper bits, a plurality of comparators for lower bits, an encoder for upper bits, an encoder for lower bits and an adder. The resistance array divides a predetermined reference voltage to generate upper reference voltages, and by dividing the step width of the upper reference voltage, generates lower reference voltages. The plurality of comparators for the upper bits compare the analog input signal with the upper reference voltages, and applies the result of comparison to the encoder for the upper bits. The encoder for the upper bits calculates an estimated value of the upper bits based on the result of comparison, and select second reference voltages in the range provided by adding $\pm\frac{1}{2}$ LSB to 1LSB corresponding to the estimated value of the upper bits. The plurality of comparators for the lower bits calculate the lower bits and a correcting bit based on the selected second reference voltages. The adder adds the correcting bit to the estimated value of the upper bits to correct the estimated value.

8 Claims, 5 Drawing Sheets

FIG. 2

| Qm3 | Qm2 | Qm1 | Qm0 | SE3 | SE2 | SE1 | SE0 | Dm1 | Dm0 |
|---|---|---|---|---|---|---|---|---|---|
| 0 | 0 | 0 | 0 | 0 | 0 | 0 | 1 | 0 | 0 |
| 0 | 0 | 0 | 1 | 0 | 0 | 1 | 1 | 0 | 0 |
| 0 | 0 | 1 | 1 | 0 | 1 | 1 | 0 | 0 | 1 |
| 0 | 1 | 1 | 1 | 1 | 1 | 0 | 0 | 1 | 0 |
| 1 | 1 | 1 | 1 | 1 | 0 | 0 | 0 | 1 | 1 |

FIG. 3

| Qn7 | Qn6 | Qn5 | Qn4 | Qn3 | Qn2 | Qn1 | Qn0 | Dn | D1 | D0 |
|---|---|---|---|---|---|---|---|---|---|---|
| 0 | 0 | 0 | 0 | 0 | 0 | 0 | 0 | 0 | 0 | 0 |
| 0 | 0 | 0 | 0 | 0 | 0 | 0 | 1 | 0 | 0 | 1 |
| 0 | 0 | 0 | 0 | 0 | 0 | 1 | 1 | 0 | 1 | 0 |
| 0 | 0 | 0 | 0 | 0 | 1 | 1 | 1 | 0 | 1 | 1 |
| 0 | 0 | 0 | 0 | 1 | 1 | 1 | 1 | 1 | 0 | 0 |
| 0 | 0 | 0 | 1 | 1 | 1 | 1 | 1 | 1 | 0 | 1 |
| 0 | 0 | 1 | 1 | 1 | 1 | 1 | 1 | 1 | 1 | 0 |
| 0 | 1 | 1 | 1 | 1 | 1 | 1 | 1 | 1 | 1 | 1 |
| 1 | 1 | 1 | 1 | 1 | 1 | 1 | 1 | 1 | 0 | 0 |

FIG. 4

| Dm1 | Dm0 | Dn | OFL | D3 | D2 |
|---|---|---|---|---|---|
| 0 | 0 | 0 | 0 | 0 | 0 |
| 0 | 0 | 1 | 0 | 0 | 1 |
| 0 | 1 | 0 | 0 | 0 | 1 |
| 0 | 1 | 1 | 0 | 1 | 0 |
| 1 | 0 | 0 | 0 | 1 | 0 |
| 1 | 0 | 1 | 0 | 1 | 1 |
| 1 | 1 | 0 | 0 | 1 | 1 |
| 1 | 1 | 1 | 1 | 0 | 0 |

FIG. 6  PRIOR ART

| P3 | P2 | P1 | S3 | S2 | S1 | S0 | D3 | D2 |
|----|----|----|----|----|----|----|----|----|
| 0  | 0  | 0  | 0  | 0  | 0  | 1  | 0  | 0  |
| 0  | 0  | 1  | 0  | 0  | 1  | 0  | 0  | 1  |
| 0  | 1  | 1  | 0  | 1  | 0  | 0  | 1  | 0  |
| 1  | 1  | 1  | 1  | 0  | 0  | 0  | 1  | 1  |

FIG. 7  PRIOR ART

| Q3 | Q2 | Q1 | D1 | D0 |
|----|----|----|----|----|
| 0  | 0  | 0  | 0  | 0  |
| 0  | 0  | 1  | 0  | 1  |
| 0  | 1  | 1  | 1  | 0  |
| 1  | 1  | 1  | 1  | 1  |

SERIAL-TO-PARALLEL TYPE ANALOG-DIGITAL CONVERTING APPARATUS AND OPERATING METHOD THEREOF

BACKGROUND OF THE INVENTION

1. Field of the Invention

The present invention relates to an analog/digital converter for converting an analog input signal to a digital signal and, more specifically, to a serial-to-parallel type analog/digital converter converting an analog input signal by dividing the signal into upper bits and lower bits.

2. Description of the Background Art

As digital image processing technique has been developed recently, A/D converters capable of high speed operation and having high resolution have come to be in great demand. A/D converters capable of high speed operation includes flash type and serial-to-parallel type.

In a flash A/D converter, the number of comparators increases exponentially as the number of bits increases, in order to provide high resolution. Therefore, it is difficult to provide a compact semiconductor integrated circuit. In a serial-to-parallel type A/D converter, the number of comparators can be significantly reduced as compared with the flash converter, since analog input signals are divided into upper bits and lower bits to be subjected to A/D conversion. Therefore, a compact semiconductor integrated circuit can be realized by using the serial-to-parallel type converters.

FIG. 5 is a block diagram showing a conventional serial-to-parallel A/D converter. This example has a 4-bit structure. Referring to the figure, the analog/digital converter (hereinafter referred to as an A/D converter) includes a semiconductor substrate A, voltage comparators M1, M2 and M3 for upper bits, voltage comparators N1, N2 and N3 for lower bits, a voltage terminal T1 for supplying a predetermined reference voltage Vref−, a voltage terminal T2 for supplying a reference voltage Vref+, resistors R0-R15 connected in series between voltage terminals T1 and T2, switches SW10 to 12, SW20 to 22, SW 30 to 32 and SW40 to 42 for selecting reference voltages to voltage comparators N1-N3 for the lower bits, an encoder 1 for the upper bits, and an encoder 2 for the lower bits. Each of the voltage comparators M1-M3 and each of the voltage comparators N1-N3 has two input terminals, one of which is connected to receive a reference voltage divided by the resistors and, the other input terminal is commonly connected to an analog signal input terminal Tin. Resistors R0-R3 constitute a group, R4-R7 constitute another group, R8-R11 form still another group, and resistors R12-R15 constitute still another group. The groups of resistors R0-R3, R4-R7, R8-R11 and R12-R15 divide a voltage applied between voltage terminals T1 and T2, and generates reference voltages Vm1, Vm2 and Vm3 for the upper bits. The reference voltages Vm1 to Vm3 for the upper bits generated in this manner are supplied to voltage comparators M1-M3, respectively, and compared with an analog signal Vin by respective voltage comparators M1-M3. When Vin > reference voltage, "1" ("H" level signal) is output, and when Vin ≦ reference voltage, "0" ("L" level signal) is output. Encoder 1 for the upper bits encodes results P1-P3 of comparison by voltage comparators M1-M3 and provides upper 2 bits of digital outputs D2 and D3. Encoder 1 also generates signals S0-S3 for selecting reference voltages for the lower bits based on the results P1-P3 of the voltage comparison, and provides the signals S0-S3 to switches SW10-SW12, SW20-SW22, SW30-SW32, and SW40-SW42, respectively. The switches turn on when the corresponding one of the signals S0-S3 is "1", and turns off when the signal is "0". The reference voltages Vn1, Vn2 and Vn3 for the lower bits selected by the selecting signals S0-S3 are supplied to voltage comparators N1-N3, respectively. Each of the comparators N1-N3 compares the selected reference voltage with the analog input signal Vin. When Vin > reference voltage, it outputs "1", and when Vin ≦ reference voltage, it outputs "0". The results Q1-Q3 of such comparisons are supplied to encoder 2 for the lower bits, and lower 2 bits of digital outputs D0 and D1 are provided from encoder 2. FIG. 6 is a truth table of encoder 1 for the upper bits, and FIG. 7 is a truth table of encoder 2 for the lower bits.

Assume that the analog input signal Vin is at a potential between a node X1 of resistors R9 and R10, and a node X2 of resistors R10 and R11. Digital outputs at this time will be described. Since analog input signal Vin satisfies the condition Vm2 < Vin < Vm3, the results of comparisons from voltage comparators M1-M3 will be P1 = "1", P2 = "1" and P3 = "0". From the truth table of FIG. 6, digital outputs of the upper bits will be D2 = "0" and D3 = "1". As to the signals S0-S3 for selecting the reference voltages, the switch S2 only attains "1", and other signals attain "0". Therefore, switches SW30-SW32 are turned on, and respective nodes of resistors R8-R11 are connected to voltage comparators N1 to N3. Consequently, reference voltages Vn1 to Vn3 are respectively supplied to voltage comparators N1 to N3. At this time, the analog input signal Vin satisfies the relation Vn2 < Vin < Vn3, and therefore results of comparison from voltage comparators N1 to N3 will be Q1 = "1", Q2 = "1" and Q3 = "0". Consequently, digital outputs of the lower bits will be D0 = "0" and D1 = "1", in accordance with FIG. 7. Thus "1010" are provided as digital signals D3-D0.

However, in the A/D converter shown in FIG. 5, A/D conversion error arises from the layout of various elements on the semiconductor substrate. More specifically, interconnection of the power supply, and the positions and directions of comparators M1-M3 and N1-N2 cause a difference in precision of comparison, a difference in offset voltages between comparators M1-M3 for the upper bits and comparators N1-N3 for lower bits, and therefore, a significant error is likely to occur in a conversion code at the interface between the upper and lower bits. In order to solve this problem, a method has been proposed in which the range of measurement of the lower bits is enlarged to 3LSB to provide a correction code with respect to 1LSB of the upper bits, and the upper bits are corrected by this correction code. However, enlargement to 3LSB makes circuit structure complicated, and hence layout becomes difficult.

In addition, in this method, the time for conversion for the upper bits differs from that for the lower bits. Therefore, a highly precise sample/hold circuit for retaining the analog signal must be provided in the preceding stage of the A/D converter.

In order to solve the problem of sampling and holding, a method is known in which sample/hold circuits are distributed to respective comparators. This method is especially advantageous when a chopper type comparator is employed in a CMOS circuit, since a chopper type comparator contains, because of its principle of operation, a sample/hold circuit.

FIG. 8 shows an example of the above mentioned chopper type comparator. The comparator includes an inverter 3 having a P channel MOSFET and an N channel MOSFET; a switching circuit S1 connected to a reference voltage Vref; a switching circuit S2 connected to an analog signal input terminal Tin; a switching circuit S3 connected between an output and an input of inverter 3; and a coupling capacitance Cs connected between outputs of switching circuits S1 and S2 and the input of inverter 3. The switching circuits S1, S2 and S3 switch in response to switching pulses CP1 and CP2 shown in FIG. 9, respectively. Switching pulses CP1 and CP2 have a complementary phase relation, and when switching circuit S1 is on, switching circuits S2 and S3 are turned off. Therefore, switching circuit S1 and switching circuits S2 and S3 are controlled complementarily. Such a voltage comparator operating in this manner is called a chopper type comparator.

The operation of the chopper type comparator will be described. When switching circuits S2 and S3 are turned on by the switching pulse CP2, the voltage at input and output terminals of inverter 3 are set to the level of the logic threshold value Vth of inverter 3. Consequently, a difference between the analog input signal Vin and the logic threshold level Vth of inverter is charged in the capacitor Cs. At this time, the charge voltage Vi of the capacitor Cs will be $$V_i = V_{in} - V_{th}$$

When switching circuit S1 is turned on by the switching pulse CP1, a reference voltage Vref is applied to capacitor Cs. Consequently, the charge voltage V2 of capacitor Cs will be $$V_2 = V_{ref} - (V_{in} - V_{th}) = \Delta V + V_{th}$$

where, $\Delta V = V_{ref} - V_{in}$

Inverter 3 inverts and amplifies a difference $\Delta V$ between input signal Vin sampled and held by the capacitor Cs and switching circuit and reference voltage Vref. The amplified signal is provided to output terminal CO as a result of comparison.

Even in such a chopper type comparator, the above described problem of different offset voltages of comparator for the upper bits and the comparator for the lower bits cannot be solved.

When there is generated a time difference between a control signal for the upper bits of the sample/hold circuit and a control signal for the lower bits, the level of the analog input signal changes from the sampling/holding of upper bits to sampling/holding of the lower bits. Consequently, the level of the analog input signal goes out of the range of the selected reference voltage, causing an error in conversion.

Pipeline processing is known as a method of eliminating differences in conversion timing of the upper and lower bits (see A 20 Hz 8 bit Half-Flash CMOS A/D Converter, p55 ICD 88-8). An A/D converter having pipeline processing function disclosed in this article includes two comparators for upper bits and two comparators for lower bits. The two comparators operate alternately. Therefore, the error derived from the difference in conversion timing described above can be prevented, and in addition, time for A/D conversion can be reduced.

However, since there are two comparators for the upper bits and two comparators for the lower bits, the sample/hold control signals for controlling respective comparators are complicated, and timing control is difficult. Consequently, errors likely to occur because of timing deviation of sampling/holding between upper bits and lower bits.

SUMMARY OF THE INVENTION

An object of the present invention is to prevent generation of an error in a conversion code at a boundary between the upper bits and the lower bits in an A/D converter which converts an analog input signal to digital data by dividing the input signal into upper bits and lower bits.

Another object of the present invention is to provide a circuit structure allowing easy layout of circuit elements on a semiconductor substrate, in an A/D converter which converts an analog input signal into digital data by dividing the input signal to upper bits and lower bits.

Briefly stated, the A/D converter of the present invention converts an analog input signal to digital data by dividing the input signal to upper bits and lower bits, and it includes: a first reference voltage generator; a second reference voltage generator; a plurality of first comparators; an upper bit encoder; a plurality of second comparators; a lower bit encoder; and an adder.

The first reference voltage generator divides a predetermined reference voltage and generates a plurality of first reference voltages.

The second reference voltage generator divides each step width of the plurality of first reference voltages to generate a plurality of second reference voltages.

The plurality of first comparators compare the analog input signal with each of the first reference voltages generated by the first reference voltage generator.

The upper bit encoder calculates an estimated value of the upper bits in response to the result of comparisons from each of the first comparators, and selects a plurality of second reference voltages corresponding to a range of ½ LSB above and below the estimated value. The plurality of second comparators compare the analog input signal and each of the selected second reference voltages selected by the upper bit encoder.

The second bit encoder calculates the values of the lower bits in response to the result of comparisons from each of the second comparators.

The adder adds the value of the most significant bit of the lower bits provided by the lower bit encoder to the estimated value of the upper bits.

In operation, the upper bit encoder provides estimated values of the upper bits, and second reference voltage selection signal to select second reference voltages corresponding to a range ½ LSB above and below the first reference voltage. Each of the second comparators compares the analog input signal with the selected reference voltage, to provide a value of the lower bits. Of these lower bits, the most significant bit is used as a bit for correction. By adding the bit value for correction only to the digital value provided based on the result of comparisons from each of the first comparators, the digital values provided by the first and second comparators can be corrected. Since such correction is possible, the error in A/D conversion of the upper and lower bits derived from the difference in offset voltages generated in the first and second comparators and from the difference in timing of sampling and holding can be reduced.

In another aspect, the first and second reference voltage generators include a resistance array provided in a matrix shape on a semiconductor substrate. An end of a row of resistors of the resistance array is set to a potential corresponding to the least significant bit 1LSB of the upper bits, and the middle point of the resistance is set to the first reference voltage.

In operation, the upper bit encoder selects two rows of resistors corresponding to the estimated value, based on the estimated value of the upper bits. The resistors of each row correspond to 1LSB of the upper bit, and the voltage range of the middle point of the selected two rows of resistances corresponds to the step width of the estimated value of the upper bit. Therefore, by selecting continuous two rows of resistors, a range of 2LSB can be provided by 1LSB which is the step width of the first reference voltage plus upper and lower ½ LSB ranges. In this manner, since ±½ LSB are added to 1LSB of the upper reference voltage, the circuit structure can be simplified compared with the conventional art in which a plurality of bits are added, and various circuit elements can be easily laid out.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIG. 2 is a truth table of an encoder for upper bits in the A/D converter of FIG. 1.

FIG. 3 is a truth table of an encoder for lower bits shown in FIG. 1.

FIG. 4 is a truth table of the adder shown in FIG. 1.

FIG. 6 is a truth table of the upper bit encoder of FIG. 5.

FIG. 7 is a truth table of the lower bit encoder of FIG. 5.

DESCRIPTION OF THE PREFERRED EMBODIMENTS

Figure 1:
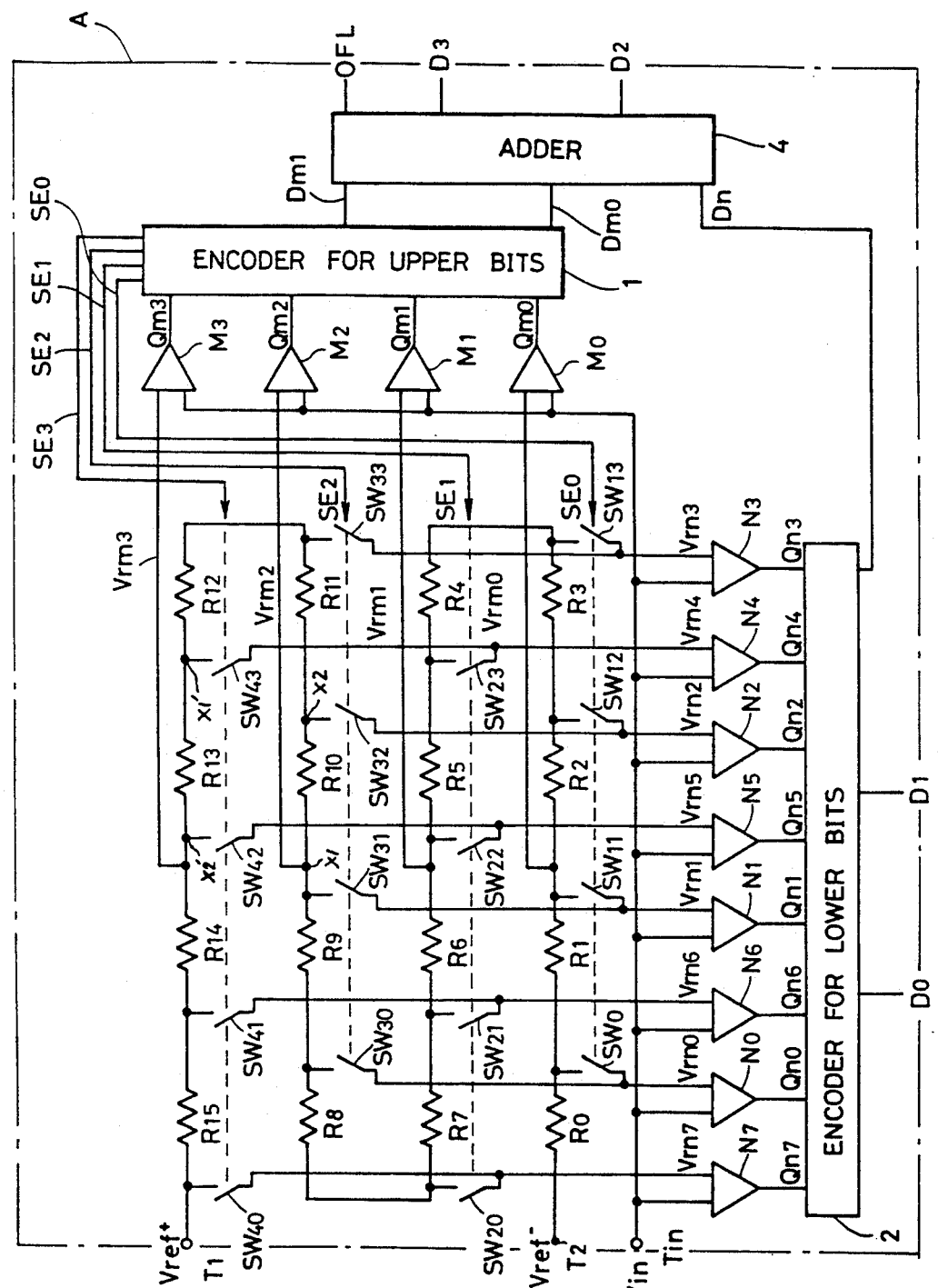
FIG. 1 is a schematic diagram showing one embodiment of the present invention
Figure 5:
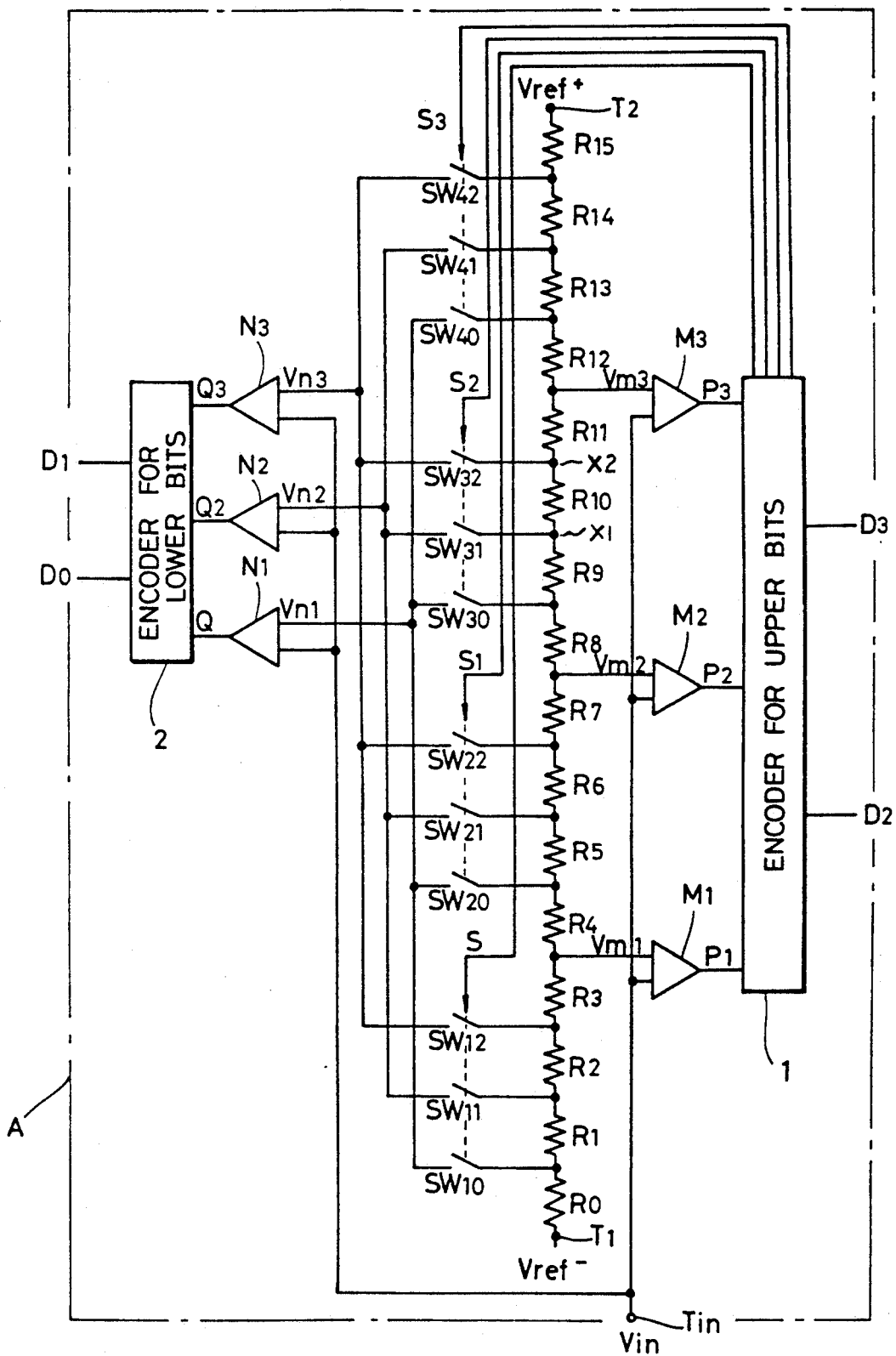
FIG. 5 is a schematic diagram of a conventional A/D converter.
Figure 8:
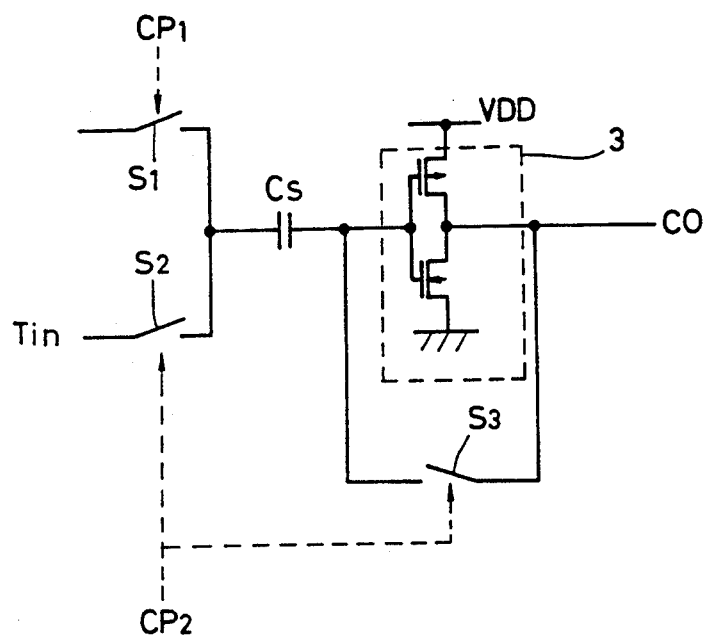
FIG. 8 is a schematic diagram of a chopper type comparator.
Figure 9:
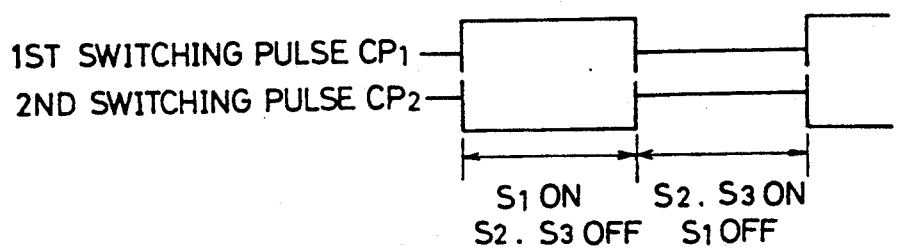
FIG. 9 shows control signals for the chopper type comparator.

FIG. 1 is a block diagram showing one embodiment of the A/D converter in accordance with the present invention. The A/D converter shown in FIG. 1 is a 4-bit A/D converter. Referring to the figure, the A/D converter includes voltage comparators M0–M3 for upper bits, voltage comparators N0–N7 for lower bits, a voltage input terminal T1 to which a reference voltage Vref− is applied, a voltage input terminal T2 to which a reference voltage Vref+ is input, resistors R0–R15 serially connected between voltage input terminals T1 and T2, an encoder 1 for upper bits, an encoder 2 for lower bits, an adder 4, and switches SW10–SW13, SW20–SW23, SW30–SW33 and SW40–SW43 connected to respective nodes of resistance for selecting reference voltages of the lower bit comparators N0–N7. Resistors R0–R15 are provided in a matrix on a semiconductor substrate A. Resistors R0–R3 form a row of resistance, R4–R7 forms another row, R8–R11 forms still another row, and R12–R15 form a further row. Reference voltages Vrm0–Vrm3 for upper bits are generated at middle points of respective rows of resistances, that is, at the node between R1 and R2, the node between R5 and R6, the node between R9 and R10, and the node between R13 and R14. Voltage comparators M0–M3 for the upper bits compare the reference voltages generated by the respective rows of resistances with the level of an analog signal input, and provides results of the comparisons thereof, Qm0–Qm3. Encoder 1 for the upper bits generates upper bit digital outputs Dm0 and Dm1 based on the results of the comparisons Qm0–Qm3 from voltage comparators M0–M3, and generates signals SE0–SE3 for selecting resistances for generating reference voltages for the lower bits. The signals SE0–SE3 are supplied to switches SW10–SW13, SW20–SW23, SW30–SW33 and SW40–SW43, respectively.

The reference voltages for the lower bits selected in this manner are applied to voltage comparators N0–N7, respectively. Voltage comparators N0–N7 compare the level of the analog input signal Vin with reference voltages Vrm0–Vrm7 for the lower bits, respectively, and outputs the results of comparison Qn0–Qn7. The results of comparison Qn0–Qn7 are supplied to an encoder 2 for the lower bits. Encoder 2 generate lower 2 bits of digital outputs D0–D1 and a code Dn for correcting the upper bits. The encoder 1 for the upper bits determines based on the results of comparison Qm0–Qm3 of voltage comparators M0–M3, to which range of LSB of the upper bits the level of the analog input signal belongs. The encoder 1 generates selecting signals SE0–SE3 to select two rows of resistances in the range of the aforementioned range ±½ LSB, and provides digital outputs Dm0 and Dm1. The truth table of encoder 1 is shown in FIG. 2. Encoder 2 for the lower bits provide lower digital outputs D0 and D1 and upper bit correcting code Dn corresponding to outputs Qn0–Qn7 from voltage comparators N0–N7. The truth table of encoder 2 for the lower bits is shown in FIG. 3. The lower 2 bits D0 and D1 from encoder 2 are directly provided as digital outputs. Meanwhile, the upper bit correcting code Dn is applied to an adder 4, and adder 4 adds the correcting code Dn to upper bit outputs Dm0 and Dm1 from encoder 1. Digital outputs D2 and D3 corrected by this addition are provided as upper 2 bits. In case an overflow is generated, an overflow signal OFL is output. The truth table of adder 4 is shown in FIG. 4.

Assume that the analog input signal Vin is at a potential between a node X1 between resistors R9 and R10 and a node X2 between resistors R10 and R11, as in the above described prior art. At this time, the level of the analog input signal Vin is Vrm2<Vin<Vrm3, and therefore results of comparison from voltage comparators M0–M3 are Qm0="1", Qm1="1", Qm2="1" and Qm3="0". From the truth table of FIG. 2, the upper bit digital outputs will be Dm0="0" and Dm1="1". Therefore, as to signals for selecting the reference resistance, signals SE2 and SE3 attain "1" and other selecting signals attain 0. Therefore, switches SW30–SW33 and switches SW40 SW43 are turned on, nodes of resistors R8–R15 are respectively connected to voltage comparators N0–N7, and reference voltages Vrn0–Vrn7 are supplied to the comparators. At this time, since the analog input signal Vin is Vrn1<Vin<Vrn2, the results of comparison from voltage comparators N0–N7 will be Qn0="1", Qn1=−"1"

and Qn2–Qn7 = "0". Therefore, according to the truth table of FIG. 2, digital outputs of the lower bits will be D0 = "0", D1 = "1" and Dn = "0". Out of these digital outputs, the upper bit correcting code Dn is added to upper bit digital outputs Dm0 and Dm1 in adder 4, and as corrected digital outputs, D2 = "0" and D3 = "1" are provided. The digital signals D3–D0 corrected in this manner will be "1010", whereby analog/digital conversion can be correctly carried out.

Assume that after the digital values of upper bits are provided, the sampling value of the analog input-signal Vin of the lower bits moves because of an offset voltage or of a time lag, and the value has the potential between the node X1' between reference voltage resistors R12 and R13 and the node X2' between R13 and R14. In this case, analog input signal Vin is $Vrn4 < Vin < Vrn5$, and the results of comparisons from voltage comparators N0–N7 are Qn0–Qn4 = "1" and Qn5–Qn7 = "0". Therefore according to the truth table of FIG. 2, digital outputs of lower bits will be D0 = "1", D1 = "0" and Dn = "1". Out of the lower bit digital outputs, the upper bit correcting code Dn is added to the upper bit digital outputs Dm0 and Dm1 "10" which have been output in advance, and D2 = "1" and D3 = "1" are output as the corrected digital output from adder 4. In this manner, digital signals D3–D0 = "1101" can be provided by correction with respect to the preceding analog input signal. In this manner, a correct digital value can be provided.

According to the above described embodiment, since the voltage comparators for the lower bits operate in the range of 1LSB of the upper bits and $\pm \frac{1}{2}$ LSB for conversion, comparison is done in the range of $\pm \frac{1}{2}$ LSB even when the sampling value fluctuates due to the offset voltage or a time lag and based on the result of the comparison, the upper bits can be corrected to provide the correct digital converted value. In addition, offset error and error in conversion due to time lag derived from the layout of comparators and interconnections can be reduced.

The voltage at the terminal end of each resistance provided in the row direction of the resistance array corresponds to 1LSB of the upper bits, and the voltages at both ends are divided corresponding to the number of lower bits (n). In addition, the middle point of one row of resistance is connected to the input terminal of the upper bit comparators. Therefore, compared with the conventional structure in which a plurality of LSBs are added, the number of redundant bits can be reduced. Therefore, compared with the prior art, the circuit structure and the layout structure can be made simple.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. An A/D converting apparatus for converting an analog input signal to digital data by dividing the input signal to upper bits and lower bits, comprising:
    means for dividing a predetermined reference voltage for generating a plurality of first reference voltages;
    means for dividing each step width of each of said plurality of first reference voltages to provide a plurality of second reference voltages;
    a plurality of first comparing means for comparing each of said generated first reference voltages with said analog input signal;
    means responsive to a result of comparisons from each of said first comparing means for calculating estimated values of said upper bits and for selecting a plurality of second reference voltages corresponding to a range $\frac{1}{2}$ LSB above and below the LSB of the estimated values,
    a plurality of second comparing means for comparing said analog input signal with each of said selected second reference voltages;
    means responsive to a result of comparisons from each of said second comparing means for calculating values of lower bits; and
    means for adding the most significant bit value of said calculated lower bits to the estimated values of said upper bits.

2. The A/D converting apparatus according to claim 1, wherein
    said A/D converting apparatus includes a semiconductor substance, and
    said means for generating the plurality of first reference voltages and said means for generating the plurality of second reference voltages include a resistance array having a plurality of resistors arranged in a matrix on said semiconductor substrate, said resistance array being successively connected starting from the first row of the matrix to the last row of the matrix.

3. The A/D converting apparatus according to claim 2, wherein
    said resistance array includes a plurality of resistances provided in the row direction corresponding to said plurality of first references voltages, and each said resistance includes a plurality of resistors corresponding to said second reference voltages.

4. The A/D converting apparatus according to claim 3, wherein
    each said resistance has its terminating end set to a potential corresponding to 1LSB of said upper bit, and its middle point set to said first reference voltage.

5. The A/D converting apparatus according to claim 1, wherein
    each said first comparing means includes means for sampling/holding time divisionally said analog signal and said first reference voltage, and
    means for inverting and amplifying a potential difference between the sampled/held analog input signal and the first reference voltage; and
    each said second comparing means includes means for sampling/holding said analog input signal and said second reference voltage time divisionally, and
    means for inverting and amplifying a potential difference between said sampled/held input signal and said second reference voltage.

6. The A/D converting apparatus according to claim 1, wherein
    said second reference voltage generating means includes a plurality of resistors for dividing each step width of said first reference voltages;
    said means for selecting the plurality of second reference voltages includes control signal generating means for generating a control signal for encoding results of comparisons from said plurality of first comparing means in accordance with a prescribed logic equation and for selecting said plurality of second reference voltages, and switching means connected between both ends of each said resistor and an input of said second comparing means, switching in response to said generated control signal.

7. The A/D converting apparatus according to claim 1, wherein said range of ½ LSB above and below the LSB of said estimated value is the range provided by adding a voltage corresponding to ne half of said step width to the upper side and the lower side of the step width of the first reference voltage corresponding to the estimated value.

8. A method of operating an A/D converting apparatus for converting an analog input signal to digital data by dividing the signal to upper bits and lower bits, comprising the steps of generating a plurality of first reference voltages by dividing a predetermined reference voltage;

generating a plurality of second reference voltages by dividing each step width of said plurality of first reference voltages;

comparing said analog input signal with each of said generated first reference voltages;

calculating estimated values of said upper bits in response to the result of said comparison and selecting a plurality of second reference voltages corresponding to a range of ½ LSB above and below the LSB of the estimated values;

comparing said analog input voltage with each of said selected second reference voltages;

calculating the values of the lower bits in response to the result of said comparison with said analog signal and each of said second reference voltages; and adding the calculated value of the most significant bit of the lower bits to the estimated values of said upper bits.

* * * * *